United States Patent [19]

Sato

[11] Patent Number: 5,981,114
[45] Date of Patent: *Nov. 9, 1999

[54] PHOTORESIST CHECK PATTERNS IN HIGHLY INTEGRATED CIRCUITS HAVING MULTI-LEVEL INTERCONNECT LAYERS

[75] Inventor: Natsuki Sato, Tokyo, Japan

[73] Assignee: NEC Corporation, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/773,615

[22] Filed: Dec. 30, 1996

Related U.S. Application Data

[63] Continuation of application No. 08/573,866, Dec. 18, 1995, abandoned, which is a continuation of application No. 08/339,395, Nov. 14, 1994, abandoned.

[30] Foreign Application Priority Data

Nov. 16, 1993 [JP] Japan ................................. 5-308579

[51] Int. Cl.⁶ .................................................. G03C 3/00
[52] U.S. Cl. ................................ 430/11; 430/16; 430/30
[58] Field of Search .................................. 430/11, 16, 30

[56] References Cited

U.S. PATENT DOCUMENTS

| | | | |
|---|---|---|---|
| 4,679,942 | 7/1987 | Suw | 355/401 |
| 4,704,027 | 11/1987 | Phillips | 355/53 |
| 4,806,457 | 2/1989 | Yanagisawa | 430/30 |

FOREIGN PATENT DOCUMENTS

| | | | |
|---|---|---|---|
| 137632 | 11/1981 | Japan | 437/924 |
| 62-78818 | 4/1987 | Japan . | |

*Primary Examiner*—Deborah Jones
*Assistant Examiner*—Cathy F. Lam

[57] ABSTRACT

A photoresist check pattern structure in a semiconductor integrated circuit device has a pattern test region and a photoresist check pattern. The pattern test region has a plurality of step regions corresponding to surface steps developed during respective process steps for fabricating the semiconductor device. The surface steps are formed in a one-side concave shape in a plane view. The photoresist check pattern extends continuously across at least one of the surface steps in the pattern test region and which has substantially flat resist surfaces. The photo resist check patterns include a pattern formed in a dimension more severe than that according to design rules for semiconductor circuit elements on the substrate. With this, it is possible to check easily as to whether the exposure/development of photoresist films corresponding to respective interconnect layers has been carried out with the desired accuracy being maintained.

6 Claims, 6 Drawing Sheets

PHOTORESIST CHECK PATTERNS IN HIGHLY INTEGRATED CIRCUITS HAVING MULTI-LEVEL INTERCONNECT LAYERS

This is a Continuation of application Ser. No. 08/573, 866, filed on Dec. 18, 1995, now abandoned which is a Continuation of application Ser. No. 08/339,395, filed on Nov. 14, 1994, now abandoned.

BACKGROUND OF THE INVENTION (1) Field of the Invention

The present invention relates to a highly integrated semiconductor integrated circuit device (IC), and more particularly to photoresist check patterns in an IC of a kind which is provided with multi-level interconnect layers.

(2) Description of the Related Art

In recent years, along with the progress in high integration of semiconductor elements formed within a semiconductor substrate, there have been advancements in miniaturization and integration of circuit interconnect patterns which are formed on a surface of the substrate with insulating films interposed therebetween, and the advancements have reached a state wherein the patterns are required to be smaller than 0.5 µm in their line widths.

In realizing the miniaturization and high integration of elements within a semiconductor substrate, it is required to maintain, in miniaturizing and highly integrating the circuit interconnect patterns also on a surface of the substrate, the same degree of resolution as in the real image of the shield mask formed on the photoresist film during the lithography process.

Further, along with the advancement in the miniaturization, the elements concerned are becoming more complex in a three dimensional aspect. Particularly, in the dynamic RAM (DRAM) of MOS type, in order to attain the necessary charge capacitance in a very small area, it is required that the charge electrode structure be higher in its height in a vertical direction and be more complex in its shape as, for example, a stack type capacitor cell structure in which memory cells are disposed on a silicon substrate.

However, since there is a limit in the depth of focus (DOF) in the reduction step-and-repeat projection device (stepper) normally used in the exposure of the photoresist, it is becoming more difficult to attain a sufficient DOF for the miniaturized patterns described above.

Therefore, in a process for fabricating highly integrated ICs, the detection of regions with defective resolution, such as cuts at steps or short-circuiting (connection) of photoresist patterns, is extremely important.

Conventionally, for detecting defective regions in the photoresist patterns, there has been used a photoresist check pattern as shown in FIGS. 1 and 2. Shown in FIGS. 1 and 2 is an example of the check pattern in a highly integrated IC.

FIG. 1 is a top view of the photoresist check pattern, and FIG. 2 is a sectional view taken along line 2X–2X' in FIG. 1.

A process for fabricating a conventional check pattern is explained with reference to FIG. 2. First, by a known process, a field oxide film 2 is formed on a surface of a semiconductor substrate 1, and then a gate oxide film 3 is formed by thermal oxidation.

Next, after patterning the gate electrode 4 in polysilicon, an interlayer film 5 (the interlayer film here is an insulating film of such as silicon oxide and boron phosphosilicate glass (BPSG)), and a first polysilicon interconnect layer 6 is patterned, followed by formation of an interlayer film 7.

Then, a first aluminum interconnect layer 8 is deposited, and photoresists 9a, 9b and 9c are patterned. Subsequently, by using the photoresists 9a, 9b and 9c as masks, aluminum etching is carried out and the first aluminum interconnect layer is patterned.

FIGS. 1 and 2 represent a state of the process prior to the patterning of the first aluminum interconnect layer by etching.

In this conventional process, the photoresist patterns 9a, 9b and 9c are formed as check patterns respectively on three different levels of surfaces, and the presence of any regions of defective resolution are checked by confirming the resolution of the photoresists on all these levels of surfaces. When the photoresist patterns 9a, 9b and 9c on all these level surfaces are resolved into appropriate shapes, the resolution is judged as acceptable. The surfaces of the photoresist patterns 9a, 9b and 9c are made substantially flat so that good resolution can be obtained.

However, the patterns actually used in the ICs have complex shapes, and there are possibilities in which, for example, the pattern as shown in FIG. 3 exists.

The photoresist pattern shown in FIG. 3 exhibits sensitivity curves as shown in FIG. 4. Where, for example, the thickness is $T_1$, the minimum resolution exposure time will be $E_1$, and where the same is $T_2$, such time will be $E_2$. Thus, the minimum resolution exposure time is longer in the case where the thickness is thinner $T_2$.

Therefore, in the example shown in FIG. 3, where the photoresist is applied with the thickness thereof being determined at the surface for $T_1$, the thickness $T_2$ exists locally, leading to a high likelihood wherein, after the exposure and development, only the photoresist region whose thickness is $T_2$ remains.

When the problem as above has occurred, the photoresists 9d and 9e are connected, as shown in FIG. 5, so that the etching of the aluminum interconnect layer in such a state results in an interconnection failure. FIG. 3 represents a sectional view taken along line 3X–3X' of FIG. 5.

With the conventional check pattern arrangement shown in FIGS. 1 and 2, it was not possible to check the interconnection failure as described above. That is, in the conventional check pattern arrangement, the check patterns 9a, 9b and 9c were of the same height at the resist surfaces with the thicknesses of the check patterns being different from one another, so that the respective patterns 9a, 9b and 9c behaved differently in terms of the sensitivity curves as shown in and explained for FIG. 4. Despite such differences, the focus and the exposure time were so set that the check patterns at the three step regions should result all in an adequate patterning. In this way, it was not possible for the check patterns to detect the state of cuts at the sloped regions between the steps.

Furthermore, in a circuit pattern whose surface contains a concave region as shown in FIG. 6, an optical halation develops during the exposure from within the gate electrode having the concave region thereby causing the photoresist pattern 9f to be locally constricted and, in the worse case, causing lines to be broken. FIG. 7 represents a sectional view taken along line 7X–7X' in FIG. 6.

With the conventional check patterns, it has not been possible to check the problems as explained above.

A conventional method for detecting a defective pattern at a step region in a circuit pattern constituted by fine patterns on a wafer has been disclosed, for example, in Japanese Patent Application Kokai Publication No. Sho 62-78818. In the disclosed method, as in the prior art method described above, the pattern test region is provided on the wafer, and the steps formed in this region during each of the formation processes include at least a step region in which a resist pattern defect is likely to occur, and a check pattern is formed across these steps.

However, with the conventional circuit pattern detection method disclosed in the above identified Japanese Patent Application Kokai Publication No. Sho 62-78818, it is not possible to detect a defect in a photoresist pattern caused by the halation occurred in the light from inside the interconnect layer having a concave region. Further, in the method disclosed in the above publication, since the thicknesses of the photoresist layer is assumed to be substantially constant, the disclosed conventional detection method does not serve as a solution to a problem requiring the detection of such a defect in a resist pattern that occurs by differences in the sensitivity characteristics due to differences in the thicknesses of photoresist at the step regions.

SUMMARY OF THE INVENTION

An object of the present invention, therefore, is to overcome the problems existing in the prior art and to provide a photoresist check pattern which enables, in a highly integrated semiconductor circuit device containing multi-interconnect layers having steps or concave regions, to confirm easily as to whether the exposure/development of photoresist films corresponding to respective interconnect layers has been carried out with the desired accuracy being maintained.

It is another object of the present invention to provide a photoresist check pattern which enables to judge as to the acceptability of all patterns on a semiconductor substrate.

According to one aspect of the invention, there is provided a photoresist check pattern structure in a semiconductor integrated circuit device having a semiconductor substrate which internally contains a plurality of impurity diffusion layers, and a plurality of conductive interconnect layers which are formed with insulating films interposed therebetween on a surface of the semiconductor substrate, the interconnect layers having a plurality of heights from the surface of the semiconductor substrate, the photoresist check pattern structure comprising:

a pattern test region which has a plurality of step regions corresponding to surface steps developed during respective process steps for fabricating the semiconductor device, the surface steps being formed in a one-side concave shape in a plane view; and a photoresist check pattern which extends continuously across at least one of the surface steps in the pattern test region and which has substantially flat resist surfaces.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENT OF THE INVENTION

Now, a preferred embodiment of the invention is explained with reference to the drawings.

Figure 8:
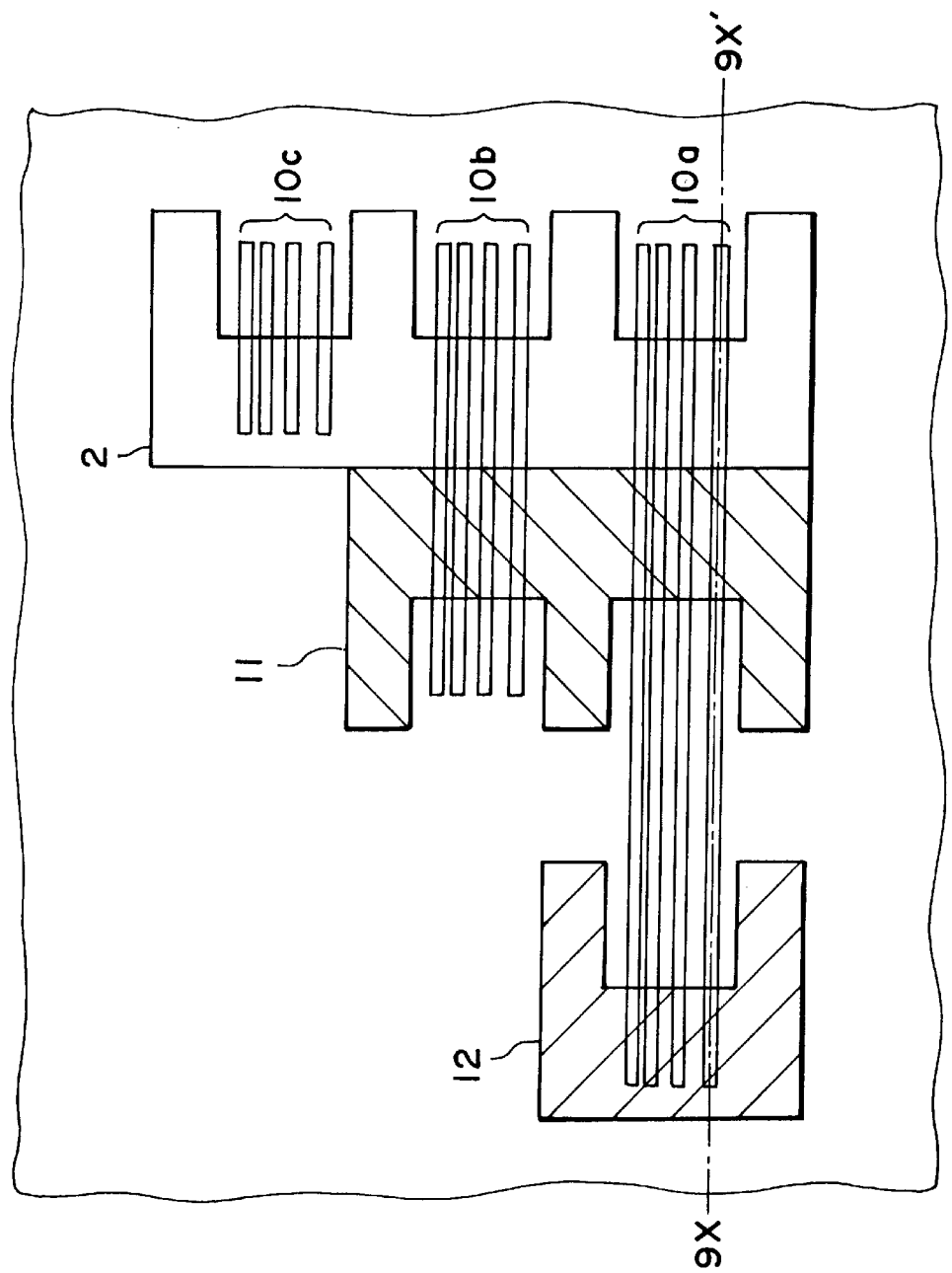
FIG. 8 is a schematic top view of an embodiment of a photoresist check pattern structure according to the invention.
Figure 9:
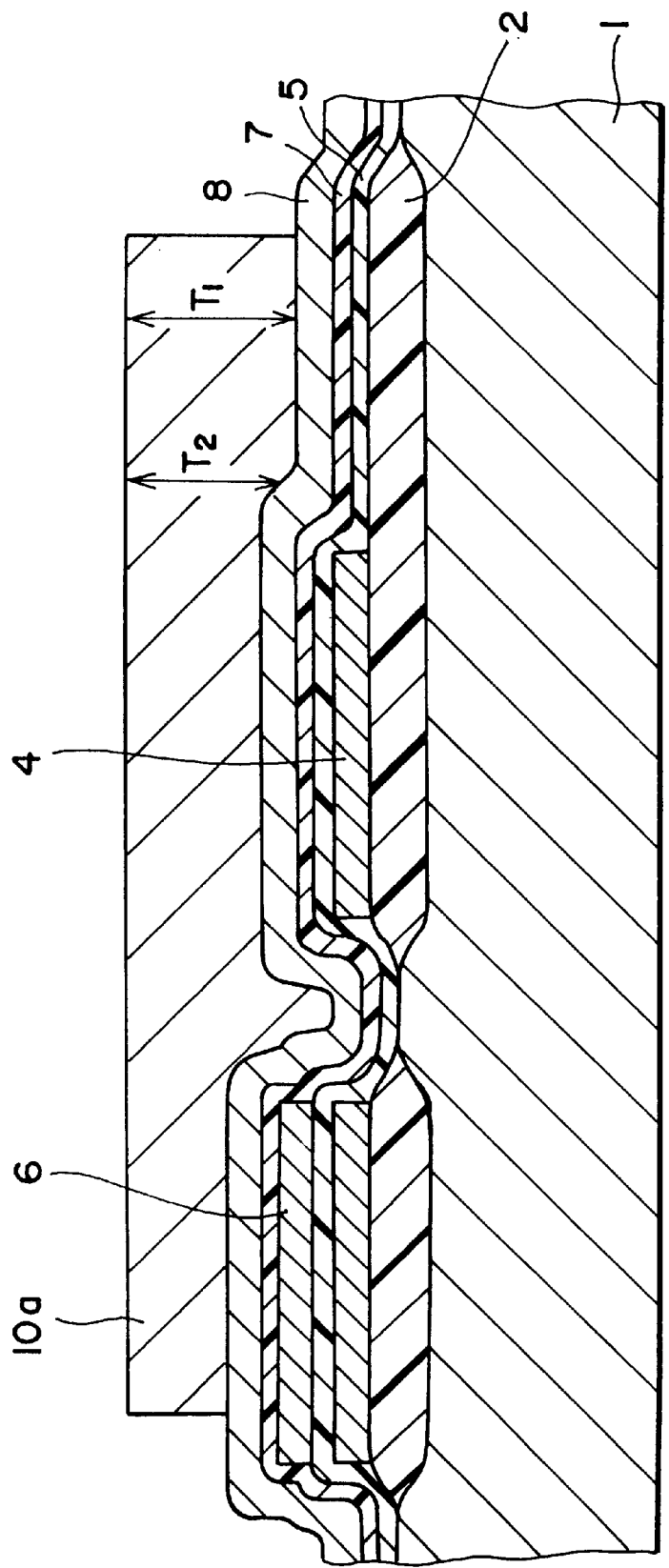
FIG. 9 is a schematic sectional view of the embodiment of the photoresist check pattern structure according to the invention, taken along line 9X–9X' of FIG. 8.

FIG. 8 shows in a top view an embodiment according to the invention, and FIG. 9 shows in a sectional view the embodiment according to the invention taken at line 9X 9X' of FIG. 8.

First, by using a conventional method, a field oxide film 2 is formed on a semiconductor substrate 1 in a comb shape when viewed from the top (FIG. 8). The field oxide film is 500 nm thick.

Then, a gate oxide film is formed by thermal oxidation (not illustrated).

When the gate electrode 4 is formed of polysilicon, the check patterns in the embodiment of the invention are patterned into a plurality of resist patterns as, for example, those depicted by 10c in FIG. 8.

In the embodiment, the resist patterns are constituted by 4 patterns with the line width of each being 1 $\mu$m. The spaces of the resist patterns are respectively 0.3 $\mu$m, 0.4 $\mu$m and 0.5 $\mu$m. The design rule for a semiconductor integrated circuit formed on the same semiconductor substrate as the check patterns in the embodiment has adopted a 0.4 $\mu$m rule.

Therefore, in the patterning of the gate electrode 4, the points which require the most severe resolution standards in the entire lithography steps are the photoresist check patterns 10c. Thus, if a microscopic observation of the resolution state of, for example, the check patterns 10c reveals no problem in the resolution state, this is the confirmation that there are no problems in the entire IC patterns.

Under the above state, the polysilicon is etched by a process such as an RIE (reactive ion etching) process and, upon the removal of the photoresist, the gate electrode 4 is formed. The thickness of the gate electrode 4 is 300 nm.

During the formation of the gate electrode 4, as seen in FIGS. 8 and 9, there are formed gate electrodes also at a step region 11 at which the field oxide film 2 and the gate electrode 4 overlap with each other and at a step region 12 at which the field oxide film 2, the gate electrode 4 and the first polysilicon interconnect layer 6 overlap with one another. The gate electrodes forming underlying layers are, as seen in FIG. 8, shaped in a one-side concave shape (that is, a C shape or a reverse C shape).

Next, an interlayer film 5 is formed followed by the formation of the first polysilicon interconnect layer 6. At this time, as the check patterns, the photoresists are patterned as shown at 10b in FIG. 8.

The lines and spaces of the photoresist patterns 10b are made the same as those in the photoresist patterns 10c. Here, too, similarly as in the case of the formation of the gate electrode 4, the points which require the most severe resolution standards in the lithography steps during the patterning of the first polysilicon interconnect layer 6 are the photoresist check patterns 10b in this embodiment.

Thus, if a microscopic observation of the resolution state of the check patterns 10b reveals no problem in the resolution state, this is the confirmation that there are no problems in the entire IC patterns.

Under the above state, the polysilicon is etched by a process such as an RIE process and, upon the removal of the photoresist, the first polysilicon interconnect layer 6 is formed. The thickness of the first polysilicon interconnect layer 6 is 200 nm.

In the above step, as seen in FIG. 8, the first polysilicon interconnect layer is patterned also at the step 12 formed by the field oxide film, the gate electrode and the first polysilicon interconnect layer.

Next, an interlayer film 7 is formed followed by the deposition of a first aluminum interconnect layer 8. At this time, as the check patterns, the photoresists are patterned as seen at 10a in FIG. 8. The lines and spaces of the photoresists are made similarly as those of the patterns 10b and 10c. Also, as seen in FIG. 9, the resist surfaces of the photoresist patterns 10a are substantially flat and this ensures good resolution.

In this case, too, similarly as in the cases of the gate electrode 4 and the first polysilicon interconnect layer 6, the points which require the most severe resolution standards in the lithography steps during the patterning of the first aluminum interconnect layer are the photoresist check patterns 10a.

Thus, if a microscopic observation of the resolution state of the check patterns 10a reveals no problem in the resolution state, this is the confirmation that there are no problems in the entire IC patterns.

Under the above state, the aluminum is etched by a process such as an RIE process and, upon the removal of the photoresist, the first aluminum interconnect layer 8 is formed. The thickness of the first aluminum interconnect layer 8 is 600 nm.

Figure 1:
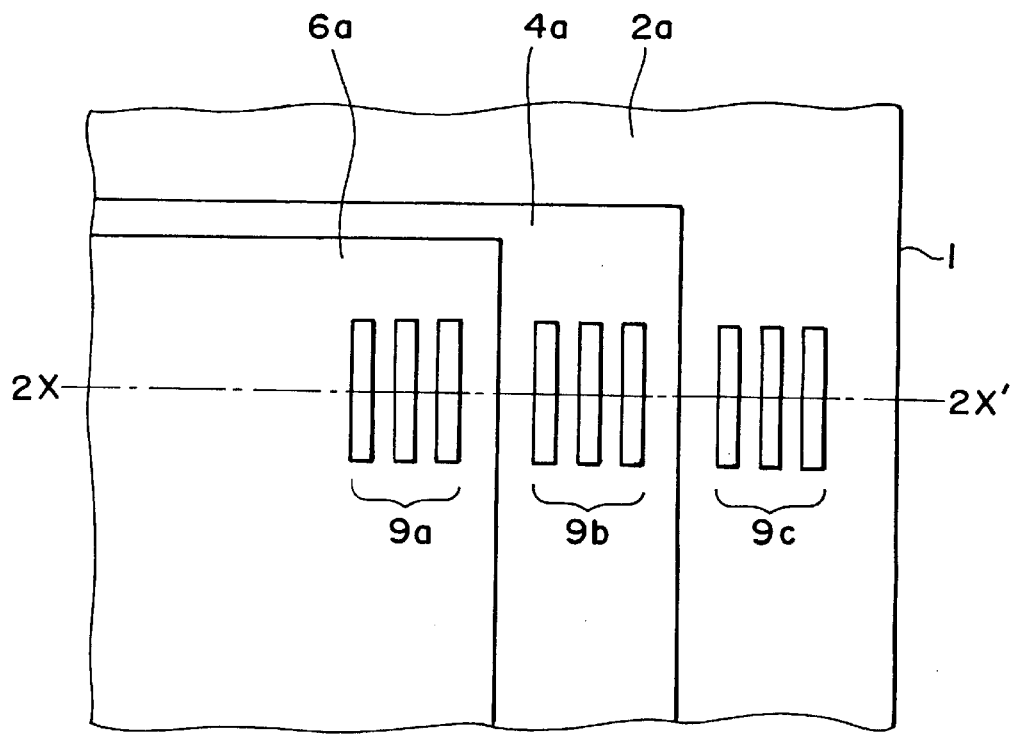
FIG. 1 is a schematic top view of a conventional photoresist pattern structure.
Figure 2:
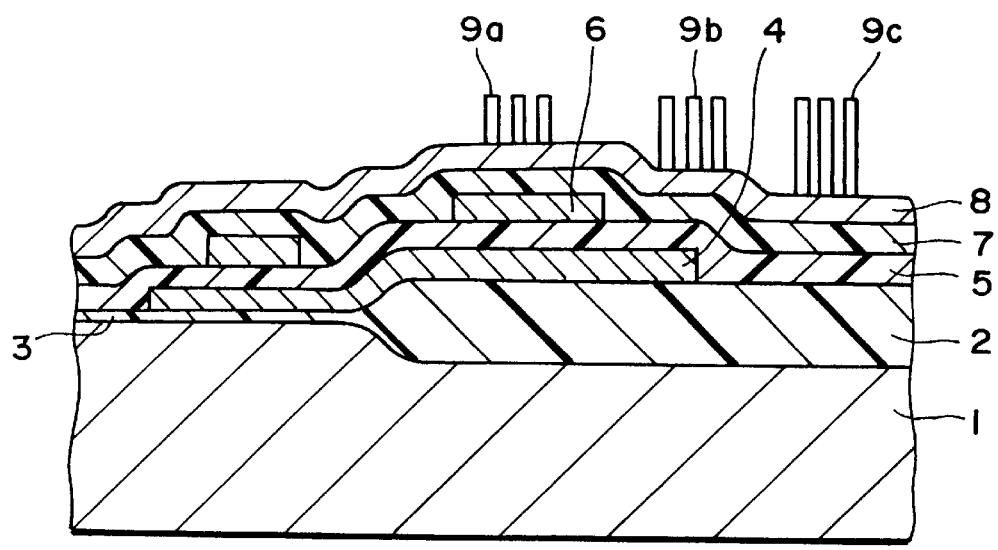
FIG. 2 is a schematic sectional view of the conventional photoresist pattern structure, taken along line 2X–2X' of FIG. 1.
Figure 3:
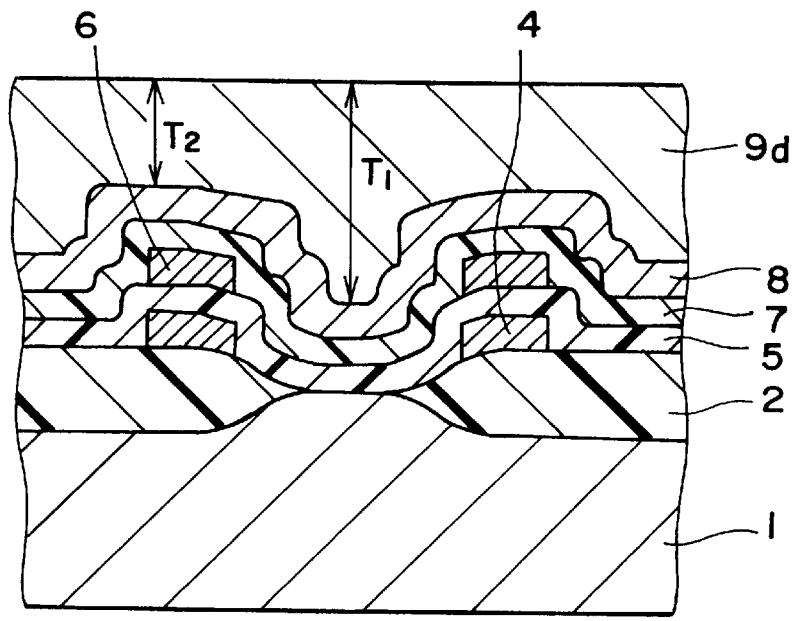
FIG. 3 is a schematic sectional view of a conventional semiconductor chip.
Figure 4:
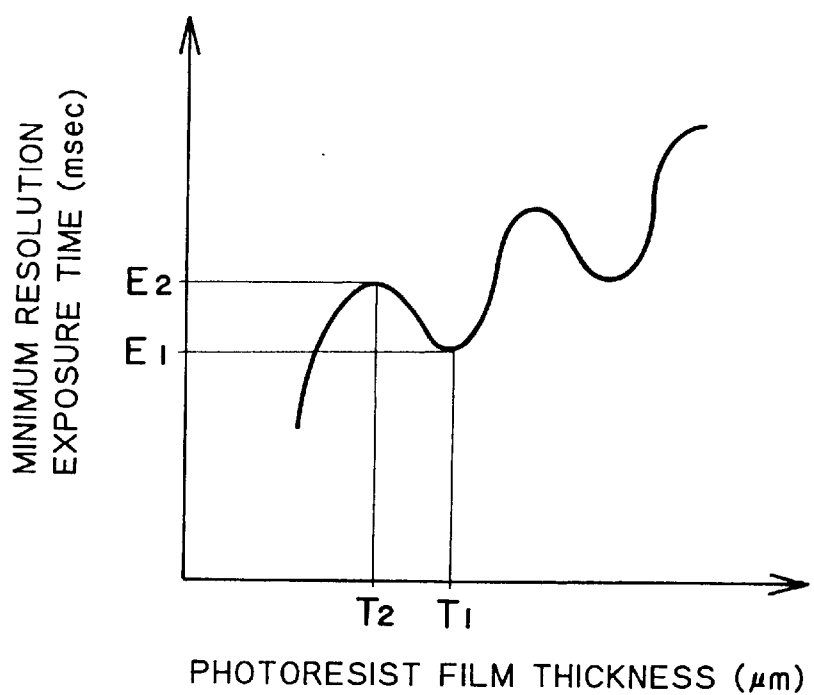
FIG. 4 is a diagram showing sensitivity curves of a photoresist in the conventional semiconductor chip shown in FIG. 3.
Figure 5:
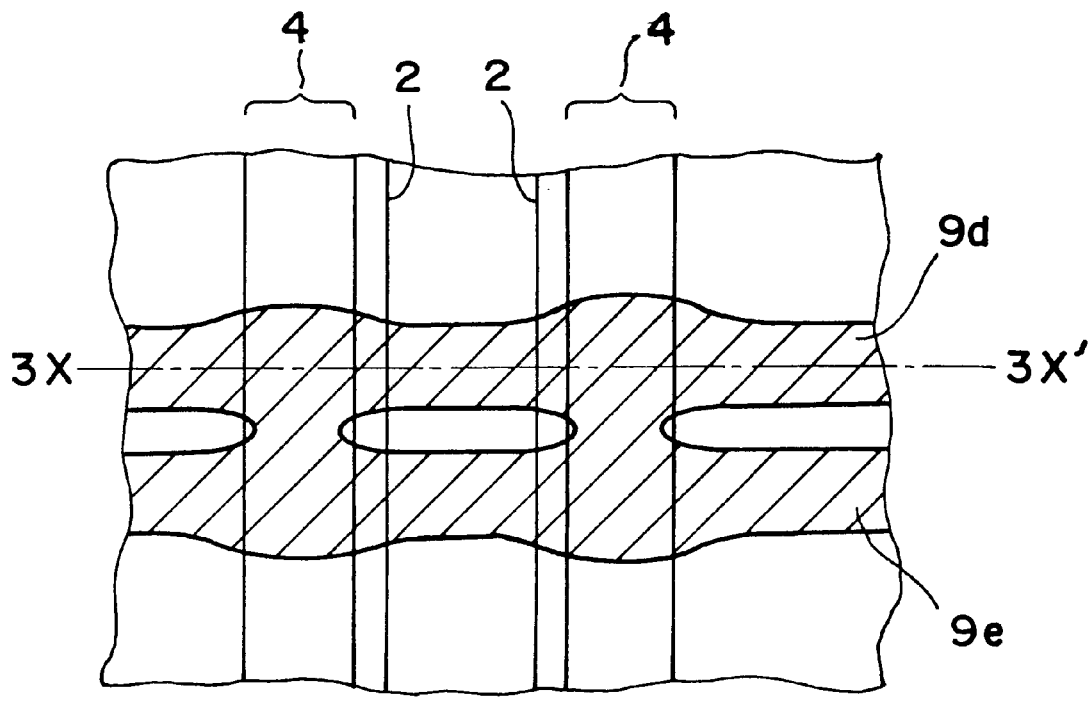
FIG. 5 is a top view of a conventional semiconductor chip for showing defects therein (FIG. 3 being the sectional view taken along line 3X–3X' of this FIG. 5)

For example, during the patterning of the first aluminum interconnect layer, if the film thickness of the photoresist above the substrate becomes $T_1$ and the step region (sloped region) between the field oxide film and the gate electrode becomes $T_2$ as shown in FIG. 9, the phenomena as shown in FIG. 4 may occur resulting in connecting of the photoresist patterns at the step region.

In the above situation, the exposure time may be prolonged or the stepper focus may be readjusted and, when the satisfactory conditions are found upon the check patterns being checked, the photolithography step may then be carried out.

With the photoresist check patterns according to the invention, because the patterns extend continuously across the step regions and the resist surfaces of the patterns are flat, the shapes of the sloped regions which could not have been checked in the prior art can be detected, and it is possible to readily discover such defects as connection of photoresists at the step regions.

Figure 6:
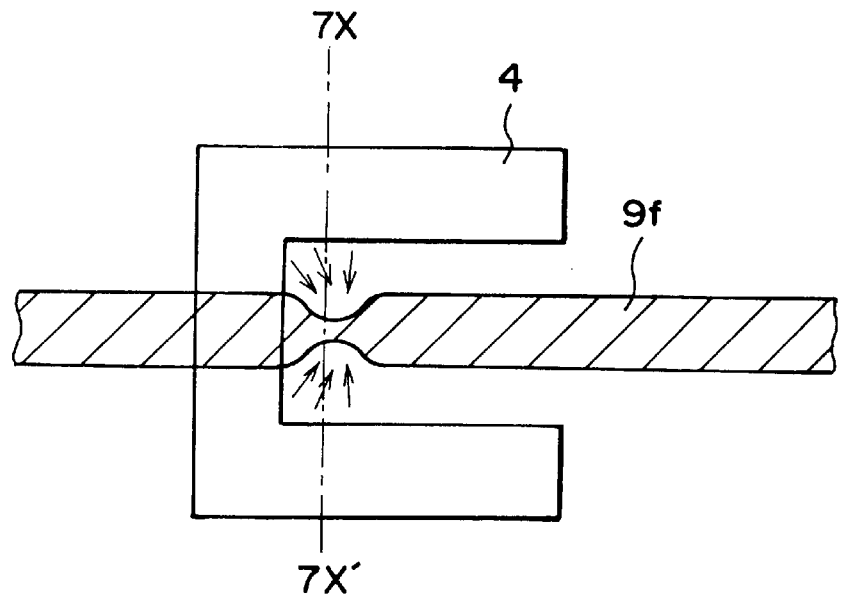
FIG. 6 is a top view of a conventional semiconductor chip for showing defects therein.
Figure 7:
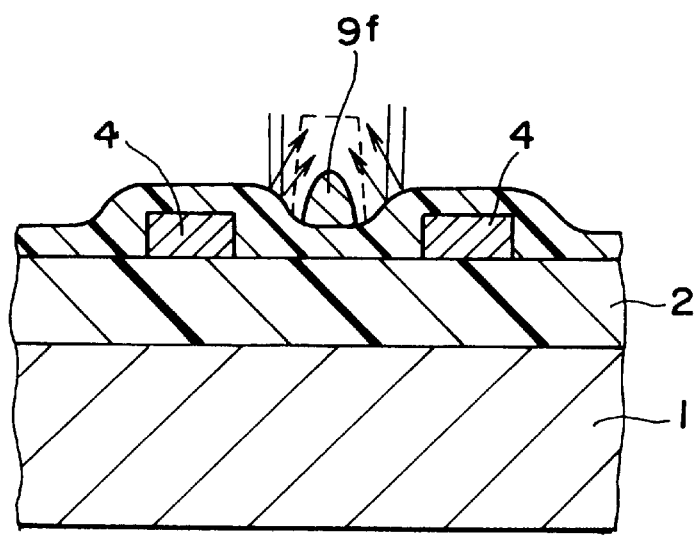
FIG. 7 is a schematic sectional view of the conventional semiconductor chip, taken along line 7X–7X' of FIG. 6.

When, as noted above, the photoresist extends across over the underlying layer surface which is in a one-side concave shape, there is a possibility, during the exposure, for the halation of light to occur inside the concave region, thereby causing the photoresist pattern to become thin locally or be broken (FIGS. 6 and 7). However, in the check patterns according to the invention, since the underlying layer surface is formed in a one-side concave shape, it is possible to readily detect any adverse influence caused by the halation of light.

When the local thinning or breakage of the photoresist caused by the halation of light is detected, the necessary adjustment may be made by reducing the exposure time or by readjusting the stepper focus while the check patterns are being checked. After the optimum conditions are determined, the wafer used for determining such conditions is handled such that the photoresist is removed, and is again exposed and patterned at the optimum conditions.

As described above, according to the invention, it is possible to detect simultaneously the two kinds of defects, namely, the short-circuiting (connection) of patterns at step regions that may occur during the lithographic process and the thinning of the patterns that may be caused by the halation of light, which could not have been detected in a conventional patterning.

Also, even within one exposure surface (one shot surface) through the stepper, there are possibilities where the patterning cannot be made uniformly due to reasons such as aberrations of a reduction lens and slopes in the exposure surfaces. In order to be able to detect such a problem, the check patterns according to the invention may be provided at least at two locations (one at a center region and the other at a corner region), preferably at four locations, within the exposure surface.

According to the invention, the photoresist check patterns formed at a plurality of locations having steps on a semiconductor chip can be checked as to their shapes in a single microscopic field of view and, since it is possible to check readily in advance to the etching of patterns as to whether the exposure in the entire chip surface is within a satisfactory depth of focus, there are advantages that the rate of defective products is significantly reduced and that the production yield of highly integrated semiconductor devices is largely enhanced.

Further, according to the invention, since the underlying layer surface at a step region is formed in a oneside concave shape and the photoresist patterns extend crossing the oneside concave shaped portion, it is possible, during the exposure process, to detect from two sides any thinning or broken state of the patterns caused by the halation of light.

Furthermore, according to the invention, since a plurality of patterns as the photoresist check patterns are provided so as to extend across the one-side concave portion at the step regions, and include the patterns whose line widths and spaces are required to meet most severe standards among the patterns formed according to the design rules of semiconductor integrated circuits, it is possible to confirm that all the patterns in the IC are acceptable once the resolution state of the check patterns through the microscopic observation is confirmed as satisfactory.

According to the invention, if the check patterns are provided at four corners of the exposure surface, it is possible to detect, in a single field of exposure by the stepper, any patterning defects that are caused by aberrations of a reduction lens or slopes in the exposure surface.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A photoresist check pattern structure in a semiconductor integrated circuit device having a semiconductor substrate, a plurality of impurity diffusion layers, and a plurality of conductive interconnect layers which are formed with insulating films interposed therebetween on a surface of said semiconductor substrate, said interconnect layers having a plurality of heights from a surface of said semiconductor substrate, said photoresist check pattern structure comprising:

a pattern test region which has a plurality of step regions corresponding to surface steps developed during respective process steps for fabricating the semiconductor device, at least one of said step regions including a planar layer formed in a C shape; and a plurality of photoresist check patterns which extend continuously across said at least one step region in said pattern test region and which have substantially flat resist surfaces.

2. The photoresist check pattern structure according to claim 1, wherein a spacing between two of said photoresist check patterns is less than a spacing allowed between semiconductor circuit elements formed on the semiconductor substrate.

3. The photoresist check pattern structure according to claim 1, wherein said photoresist check patterns are provided at at least four different locations on said semiconductor integrated circuit device.

4. The photoresist check pattern structure according to claim 1, wherein said at least one step region is a gate electrode.

5. A photoresist check pattern structure in a semiconductor integrated circuit device, the semiconductor integrated circuit device having a substrate, a plurality of impurity diffusion layers, and a plurality of conductive interconnect layers, said photoresist check pattern structure comprising:

a pattern test region formed on the substrate, the pattern test region having a plurality of layers corresponding to the layers of the semiconductor integrated circuit device and having at least one step at different heights from a surface of the substrate; and a plurality of photoresist check patterns formed on said pattern test region, wherein a spacing between two of said plurality of photoresist check patterns is less than a spacing allowed between semiconductor circuit elements formed on the semiconductor substrate and wherein the plurality of photoresist check patterns extend across the at least one step at the different heights from the semiconductor substrate.

6. The photoresist check pattern structure in a semiconductor integrated circuit device, the semiconductor integrated circuit device having a substrate, a plurality of impurity diffusion layers, and a plurality of conductive interconnect layers, said photoresist check pattern structure comprising:

a pattern test region formed on the substrate, the pattern test region having a plurality of layers corresponding to the layers of the semiconductor integrated circuit device, the pattern test region having at least one planar layer formed in a C shape having two parallel components connected by an orthogonal component; and a plurality of photoresist check patterns formed on said pattern test region, wherein a spacing between two of said plurality of photoresist check patterns is less than a spacing allowed between semiconductor circuit elements formed on the semiconductor substrate, and wherein the plurality of photoresist check patterns extend between said two parallel components and across the orthogonal component of said at least one C shaped planar layer of said pattern test region.

* * * * *